United States Patent
Jadhav et al.

(10) Patent No.: US 7,220,622 B2
(45) Date of Patent: May 22, 2007

(54) METHOD FOR ATTACHING A SEMICONDUCTOR DIE TO A SUBSTRATE AND HEAT SPREADER

(75) Inventors: Susheel G. Jadhav, Chandler, AZ (US); Daoqiang Lu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 344 days.

(21) Appl. No.: 10/948,266

(22) Filed: Sep. 22, 2004

(65) Prior Publication Data

US 2006/0063310 A1    Mar. 23, 2006

(51) Int. Cl.
    *H01L 21/58* (2006.01)
(52) U.S. Cl. .................. 438/122; 438/126; 438/615; 257/E21.511
(58) Field of Classification Search ............... 438/615
    See application file for complete search history.

(56) References Cited

U.S. PATENT DOCUMENTS

| | | | |
|---|---|---|---|
| 5,528,462 A | 6/1996 | Pendse | |
| 5,759,269 A | 6/1998 | Cutting et al. | |
| 6,074,897 A | 6/2000 | Degani et al. | |
| 6,085,967 A | 7/2000 | Grande et al. | |
| 6,161,749 A | 12/2000 | Bastacky et al. | |
| 6,773,958 B1* | 8/2004 | Wang | 438/108 |
| 2003/0047814 A1* | 3/2003 | Kwon | 257/778 |
| 2003/0089705 A1* | 5/2003 | Shi et al. | 219/685 |
| 2003/0102016 A1 | 6/2003 | Bouchard | |
| 2005/0224953 A1* | 10/2005 | Lee et al. | 257/704 |
| 2005/0284863 A1* | 12/2005 | DeBonis | 219/635 |
| 2006/0040380 A1 | 2/2006 | Besemer et al. | |

* cited by examiner

Primary Examiner—Stephen W. Smoot

(57) ABSTRACT

Disclosed are embodiments of a method of attaching a die to a substrate and a heat spreader to the die in a single heating operation. A number of conductive bumps extending from the die may also be reflowed during this heating operation. Other embodiments are described and claimed.

16 Claims, 2 Drawing Sheets

METHOD FOR ATTACHING A SEMICONDUCTOR DIE TO A SUBSTRATE AND HEAT SPREADER

FIELD OF THE INVENTION

The invention relates generally to the manufacture of semiconductor devices and, more particularly, to the attachment of a semiconductor die to a substrate and a thermal component, such as a heat spreader.

BACKGROUND OF THE INVENTION

An integrated circuit (IC) device may include a semiconductor die upon which integrated circuitry has been formed, and this die may be mounted on a package substrate or other die carrier. The die may be both electrically and mechanically coupled to the package substrate. By way of example, an array of solder bumps (or other electrical leads) extending from the die may be coupled (e.g., by a reflow process) to a corresponding array of lands (or other electrical leads) on the substrate to form electrical connections between the die and substrate. In addition, an underfill material may be disposed between the die and substrate to secure the die onto the substrate, as well as to protect the electrical connections extending between the die and substrate. The use of an array of solder bumps to provide electrical connections, as described above, is often referred to as Controlled Collapse Chip Connect (or "C4").

The IC device may further include one or more thermal components coupled with the die, these thermal components functioning to transfer away or otherwise dissipate heat generated by the integrated circuitry during operation. For example, a heat spreader may be thermally coupled with the die, and a heat sink may, in turn, be thermally coupled with the heat spreader. Typically, a first thermal interface is disposed between the die and heat spreader, and a second thermal interface is disposed between the heat spreader and heat sink. The first thermal interface mechanically and thermally couples the die with the heat spreader, with the second thermal interface performing a similar role between the heat spreader and heat sink. The thermal interfaces may comprise any thermally conductive material capable of providing the requisite mechanical attachment, such as a solder material.

The assembly of the above-described IC device may require multiple heating, or reflow, operations. For example, a first heating process may be performed to both cure (or at least partially cure) the underfill material and reflow the C4 solder bumps, this first heating operation mechanically and electrically coupled with die with the package substrate. A second heating step may then be performed to reflow a solder thermal interface material disposed between the die and heat spreader, this second heating step reflowing the solder thermal interface material and forming a mechanical connection between the die and heat spreader. Each heating operation can increase manufacturing time and reduce through-put, while also increasing costs.

DETAILED DESCRIPTION OF THE INVENTION

Disclosed are embodiments of a method for attaching a semiconductor die to a substrate and a heat spreader (or other thermal component). According to one embodiment, an assembly comprises a substrate, an IC die placed over the substrate, a layer of underfill material disposed between the die and substrate, a heat spreader disposed over the die, and a thermal interface disposed between the die and heat spreader. In one embodiment, the underfill material is cured and the thermal interface reflowed in a single process step. In a further embodiment, a plurality of conductive bumps (or other leads) extending from the die are reflowed during this single process step. By performing underfill cure and solder reflow in a single heating operation, process time and costs may be reduced and through-put may be increased.

Figure 1:
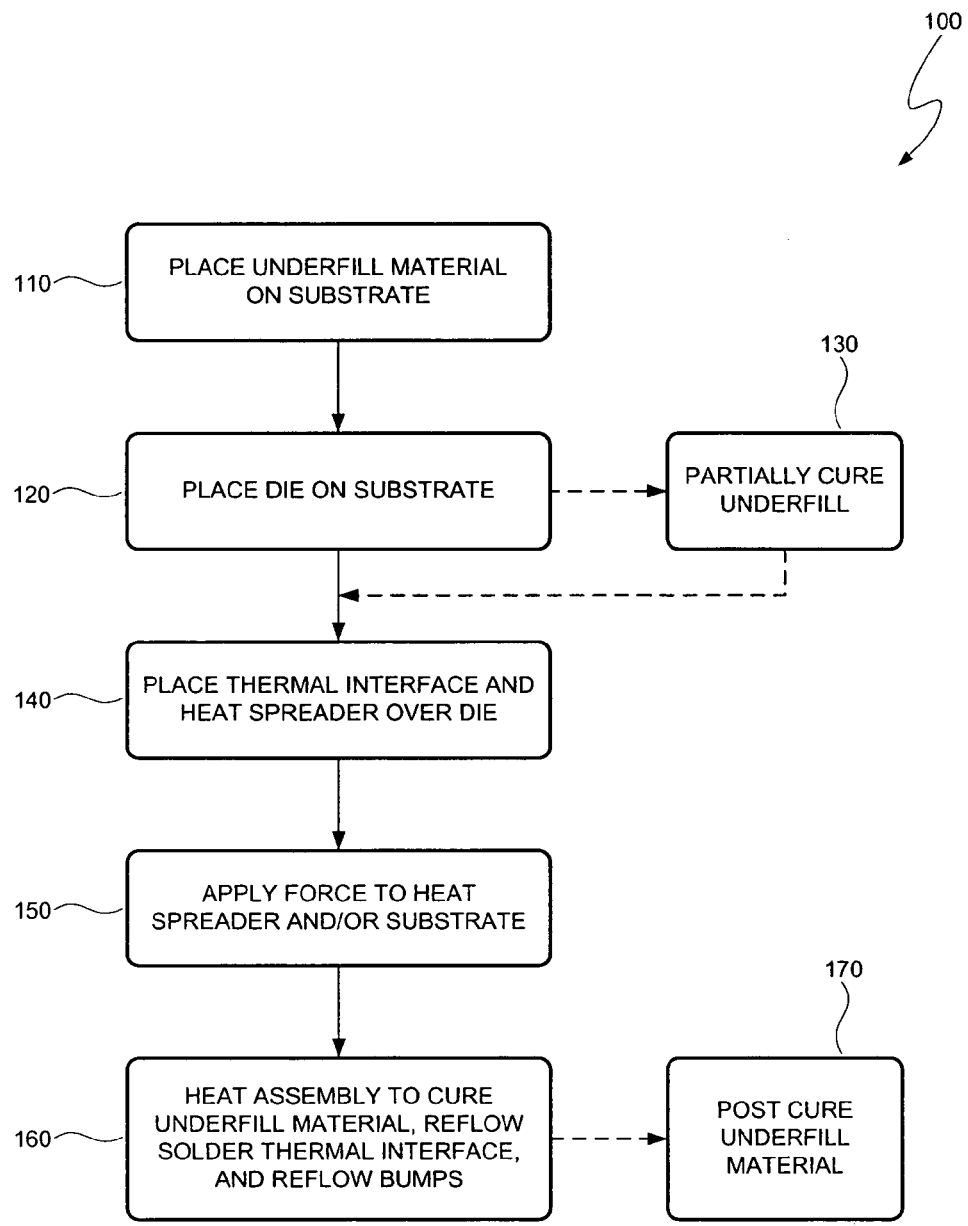
FIG. 1 is a block diagram illustrating an embodiment of a method for attaching a semiconductor die to a substrate and heat spreader.

Turning now to FIG. 1, illustrated is an embodiment of a method 100 for attaching a semiconductor die to a substrate and heat spreader (or other thermal component). Embodiments of the method 100 shown in FIG. 1 are further illustrated in the schematic diagrams of FIGS. 2A through 2D, as well as FIGS. 3A and 3B, and reference should be made to these figures as called out in the text.

Figure 2A:
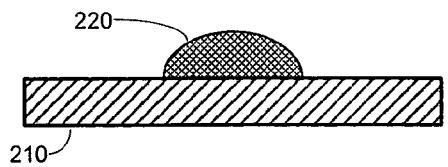
FIGS. 2A–2D are schematic diagrams illustrating embodiments of the method shown in FIG. 1.

Referring first to block 110, an underfill material is disposed on a substrate. This is illustrated in FIG. 2A, which shows a quantity of underfill material 220 which has been dispensed on a substrate 210. Substrate 210 may comprise any suitable type of package substrate or other die carrier. In one embodiment, the substrate 210 comprises a multilayer substrate including a number of alternating layers of metallization and dielectric material. Each layer of metallization comprises a number of conductors (e.g., traces), and these conductors may comprise any suitable conductive material, such as copper. Further, each metal layer is separated from adjacent metal layers by the dielectric layers, and adjacent metal layers may be electrically interconnected by conductive vias. The dielectric layers may comprise any suitable insulating material—e.g., polymers, including both thermoplastic and thermosetting resins or epoxies, ceramics, etc.—and the alternating layers of metal and dielectric material may be built-up over a core layer of a dielectric material.

Figure 3A:
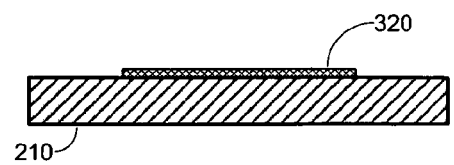
FIGS. 3A–3B are schematic diagrams illustrating further embodiments of the method shown in FIG. 1.

The underfill material 220 will ultimately function to mechanically secure an IC die to the substrate 210, as well as to fill voids between the die and substrate and to provide structural support for a number of electrical leads extending between the die and substrate. Typically, the underfill material comprises an insulating substance, such as an epoxy, although in other embodiments the underfill material may exhibit anisotropic electrical properties (e.g., an anisotropic electrically conductive epoxy). Examples of suitable underfill materials include STAYCHIP NUF-2076E, available from Cookson Semiconductor Packaging Materials, and LR-9000, available from Advanpack Solutions Ltd. In one embodiment, as shown in FIG. 2A, the underfill material 220 comprises a paste or other highly viscous material that is dispensed onto the substrate 210 as a glob. In another embodiment, which is illustrated in FIG. 3A, an underfill material 320 is dispensed onto the substrate 210 as a preform sheet of material.

Figure 2B:
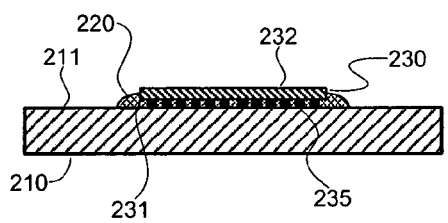

Referring now to block 120, a die is placed on the substrate. This is illustrated in FIG. 2B, where a die 230 has been placed on the substrate 210. Die 230 may comprise any type of IC device, such as a microprocessor, a network processor, an application specific integrated circuit (ASIC), a field programmable gate array (FPGA), or other type of logic device, as well as a memory device. In one embodiment, the die has a thickness of approximately 200 µm, or less. According to another embodiment, an array of conductive bumps 235 (e.g., solder bumps) or other conductive leads extends from a lower surface 231 of die 230, each of the conductive bumps being electrically connected to a bond pad (not shown in figures) on the die. The array of conductive bumps 235 mates with a corresponding array of conductive lands (not shown in figures) formed on an upper surface 211 of the substrate 210. When the conductive bumps 235 are connected with their respective lands on substrate 210 (e.g., by a reflow process, as described below), electrical communication can be established between the die and substrate.

When the die 230 is placed on and compressed against the substrate 210, the underfill material is forced to flow underneath the die and outwardly toward the die's periphery to form a uniform and perhaps void-free layer between the die and substrate, as shown in FIG. 2B. When fully cured, this layer of underfill material will both secure the die to the substrate, as well provide structural support for the conductive bumps 235. In an alternative embodiment, as set forth in block 130, the underfill material 220 may be partially cured after die placement in order to "hold" the die 230 on the substrate 210 for subsequent processing (such as movement by a pick-and-place head, etc.). For example, the underfill material may be partially cured by heating to a temperature of between 100 and 130 degrees C., for time period of between 10 and 30 minutes. To partially cure the underfill material 220, heat (and pressure to compress the underfill material) may be applied by the head of a pick-and-place machine or the head a of thermo-compression bonding machine.

Figure 3B:
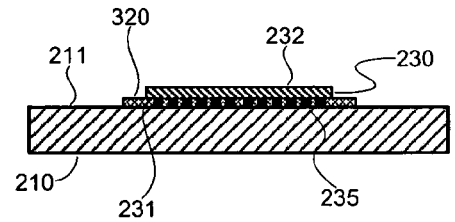

Referring to FIG. 3B, where the underfill material is dispensed as a preform sheet 320, the preform sheet may include a pattern of through holes (not shown in figures) matching the pattern of conductive bumps 235. The underfill preform 320 and die 230 are placed on substrate 210 such that the conductive bumps 235 are aligned with the holes in the underfill preform 230, as well as the lands on substrate 210. The preform sheet of underfill material 320 does not "flow" in the same manner as the paste material (see FIGS. 2A–2B), although the underfill preform may deform during die placement. Again, as set forth in block 130, the underfill material may be partially cured to hold the die 230 on the substrate 210 for subsequent processing. However, in another embodiment, the preform sheet of underfill 320 may comprise a tacky or sticky substance, and this tackiness may be sufficient to hold the die on the substrate for additional processing, in which case a partial cure of the underfill would not be needed.

Figure 2C:
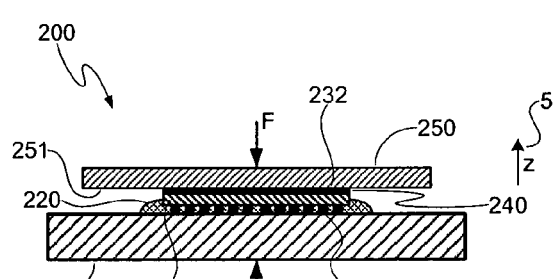
Figure 2D:
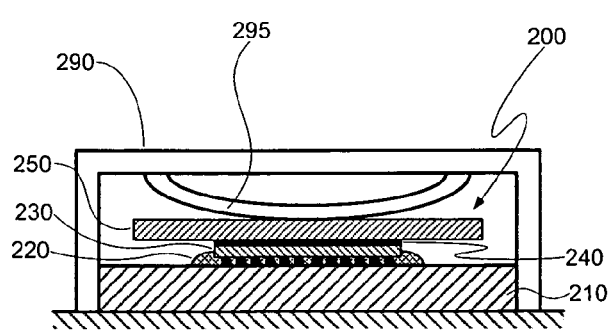

In the discussion that follows, for ease of illustration, only the embodiments of FIGS. 2A–2B are further illustrated (see FIGS. 2C and 2D). However, as the reader will appreciate, the text and embodiments that follow are also applicable to the embodiments of FIGS. 3A–3B. More generally, the disclosed embodiments are applicable to any type of underfill material, as well as to any method of dispensing the underfill material.

As set forth in block 140, a thermal interface and a heat spreader are placed over the die to form an assembly. This is illustrated in FIG. 2C, which shows a thermal interface 240 and a heat spreader 250 that have been placed over an upper surface 232 of die 230 to form an assembly 200. In the illustrated embodiment, the assembly 200 comprises substrate 210, underfill 220, die 230, thermal interface 240, and heat spreader 250. However, it should be understood that such an assembly may include additional components (e.g., a heat sink, a second thermal interface, a liquid cooling system, etc.)

The function of the heat spreader 250 is to conduct heat away from the die 230 (in the z-direction, as denoted by arrow 5), as well as to spread the heat laterally and outwards toward the periphery of the heat spreader. Ultimately, the heat spreader may be thermally coupled to a heat sink (e.g., a multi-fin heat exchanger), and the heat sink can dissipate the heat to the surrounding environment. The heat spreader 250 may be constructed from any suitable conductive material, such as, for example, copper and copper alloys, other thermally conductive metals, thermally conductive non-metals (e.g., diamond), as well as composite materials (e.g., an array of carbon nanotubes disposed in a matrix material).

The function of the thermal interface 240 is to thermally couple the heat spreader 250 with the die 230 and to conduct heat from the die to the heat spreader. The thermal interface 240 may comprise any suitable conductive material. In one embodiment, the thermal interface 240 comprises a layer of a solder material. However, the disclosed embodiments are not limited to a solder thermal interface, and it is contemplated that other materials (e.g., thermally conductive epoxies) may also be used as the thermal interface material. According to one embodiment, the thermal interface 240 comprises a preform sheet of solder (or other material) that is placed between the die 230 and heat spreader 250. According to another embodiment, the thermal interface 240 may comprise a layer of solder that has be formed on a lower surface 251 of the heat spreader 250. Where the thermal interface 240 comprises a solder material, a backside 232 of the die 230 may include a layer of material (e.g., gold) to promote adhesion with the solder thermal interface.

Referring to block 150 in FIG. 1, a force is applied to the heat spreader and/or substrate. This is also illustrated in FIG. 2C, where a force F has been applied to the assembly 200 in order to compress the heat spreader 250, thermal interface 240, die 230, and substrate 210 against one another for bonding. In one embodiment, a spring clamp is used to apply a force to the assembly. This is illustrated in FIG. 2D, which shows the assembly 200 disposed in a clamp 290. Clamp 290 includes a spring 295 to apply a compressive force to the assembly 200. Of course, the reader will appreciate that other types of clamps and alternative devices may be employed to compress the assembly for bonding.

Referring next to block 160, the assembly is heated to cure the underfill material and to reflow the solder thermal interface, as well as to reflow the conductive bumps, such that the assembly is bonded together. According to one embodiment, the underfill material 220 is cured simultaneously with reflowing of the solder thermal interface 240. In another embodiment, reflowing of the solder bumps 235 occurs simultaneously with underfill curing and reflowing of the solder thermal interface. When bonded together, the die 230 is both electrically and mechanically secured to the substrate 220, and the heat spreader 250 is both mechanically and thermally coupled with the die 210, and in one embodiment, this bonding together of the assembly 200 occurs during a single process step. Heating and bonding of the assembly 200 may, in one embodiment, be accomplished by placing the assembly (and perhaps a clamp 290) in an oven that is heated to a peak temperature of between approximately 230 and 250 degrees C. In a further embodiment, the assembly is heated to the peak temperature in multiple stages (e.g., by moving the assembly on a belt through a multi-zone oven, etc.) over a time period of several minutes.

In an alternative embodiment, as set forth in block 170, a post curing operation may be performed to further cure the underfill material. By way of example, post curing may be achieved by heating the underfill material to a temperature of between 150 and 175 degrees C. for a time period of approximately 1 to 3 hours.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. A method comprising:
    disposing an underfill material on a surface of a substrate;
    placing a die on the substrate surface, at least some of the underfill material disposed between a first surface of the die and the substrate surface, wherein an array of solder bumps extend from the die first surface and mate with a corresponding array of lands on the substrate surface;
    holding the die in position on the substrate using the underfill material;
    placing a hear spreader over an opposing second surface of the die to form an assembly, wherein a layer of a thermal interface material disposed on the beat spreader faces the second die surface; and
    heating the assembly to cure the underfill material, reflow the solder bumps, and reflow the thermal interface material.

2. The method of claim 1, further comprising applying a compressive force to the heat spreader during the heating of the assembly.

3. The method of claim 2, wherein the compressive force is applied using a clamp.

4. The method of claim 1, further comprising partially curing the underfill material prior to placement of the heat spreader on the die to hold the die on the substrate.

5. The method of claim 4, wherein the underfill material comprises a paste.

6. The method of claim 1, wherein the underfill material comprises a preform sheet of material, and a tackiness of the preform sheet is sufficient to hold the die on the substrate.

7. The method of claim 1, further comprising post curing the underfill material.

8. The method of claim 1, wherein the thermal interface material comprises a solder material.

9. A method comprising:
    disposing an underfill material on a surface of a substrate;
    placing a die on the substrate surface, at least some of the underfill material disposed between a first surface of the die and the substrate surface, wherein an array of solder bumps extend from the die first surface and mate with a corresponding array of lands on the substrate surface;
    holding the die in position on the substrate using the underfill material;
    placing a sheet of a thermal interface material on an opposing second surface of the die;
    placing a heat spreader over the sheet of thermal interface material to form an assembly; and
    heating the assembly to cure the underfill material, reflow the solder bumps, and reflow the thermal interface material.

10. The method of claim 9, further comprising applying a compressive force to the heat spreader during the heating of the assembly.

11. The method of claim 10, wherein the compressive force is applied using a clamp.

12. The method of claim 9, further comprising partially curing the underfill material prior to placement of the sheet of thermal interface material on the die to hold the die on the substrate.

13. The method of claim 12, wherein the underfill material comprises a paste.

14. The method of claim 9, wherein the underfill material comprises a preform sheet of material, and a tackiness of the preform sheet is sufficient to bold the die on the substrate.

15. The method of claim 9, further comprising post curing the underfill material.

16. The method of claim 9, wherein the sheet of thermal interface material comprises a solder material.

* * * * *